(12) United States Patent
Yamanaka

(10) Patent No.: US 8,426,746 B2
(45) Date of Patent: Apr. 23, 2013

(54) ELECTRONIC DEVICE AND POWER CONVERTER

(75) Inventor: Yasunori Yamanaka, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 229 days.

(21) Appl. No.: 13/048,904

(22) Filed: Mar. 16, 2011

(65) Prior Publication Data
US 2011/0226514 A1    Sep. 22, 2011

(30) Foreign Application Priority Data
Mar. 19, 2010   (JP) ................................ 2010-064289

(51) Int. Cl.
*H05K 1/16*   (2006.01)

(52) U.S. Cl.
USPC ........................... 174/260; 174/250; 174/255

(58) Field of Classification Search .................. 174/255, 174/260, 267, 250, 15.1; 361/748, 758, 807, 361/709, 719
See application file for complete search history.

(56) References Cited

U.S. PATENT DOCUMENTS

| | | | | |
|---|---|---|---|---|
| 6,493,249 | B2* | 12/2002 | Shirakawa et al. | 363/147 |
| 8,081,472 | B2* | 12/2011 | Tokuyama et al. | 361/716 |
| 8,279,620 | B2* | 10/2012 | Herron et al. | 361/803 |
| 2006/0232942 | A1* | 10/2006 | Nakatsu et al. | 361/710 |
| 2007/0099497 | A1 | 5/2007 | Agethen et al. | |
| 2010/0136807 | A1 | 6/2010 | Appel et al. | |

FOREIGN PATENT DOCUMENTS

| | | |
|---|---|---|
| DE | 19757938 | 7/1999 |
| DE | 102006052211 | 5/2008 |
| JP | 2007-220963 | 8/2007 |

OTHER PUBLICATIONS

Extended European Search Report for corresponding EP Application No. 11153897.1-2210, May 30, 2011.

* cited by examiner

*Primary Examiner* — Yuriy Semenenko
(74) *Attorney, Agent, or Firm* — Ditthavong Mori & Steiner, P.C.

(57) ABSTRACT

An electronic device includes an electronic component provided with leads. A printed circuit board has a front surface and a back surface and is provided with through holes and a groove hole. The through holes are capable of receiving the leads, respectively. The groove hole is formed so as to cross straight lines that connect the through holes. A first insulating spacer is provided on the groove hole between the leads so as to isolate the leads from each other and is positioned between the electronic component and the front surface of the printed circuit board. A second insulating spacer is inserted through the groove hole from the back surface of the printed circuit board and engages with the first insulating spacer so as to isolate end portions of the leads from each other.

8 Claims, 4 Drawing Sheets

ELECTRONIC DEVICE AND POWER CONVERTER

CROSS-REFERENCE TO RELATED APPLICATIONS

The present application claims priority under 35 U.S.C. §119 to Japanese Patent Application No. 2010-064289 filed Mar. 19, 2010. The contents of this application are incorporated herein by reference in their entirety.

BACKGROUND OF THE INVENTION

1. Field of the Invention

The present invention relates to an electronic device and a power converter.

2. Discussion of the Background

In electronic devices mounted on printed circuit boards by soldering, printed circuit boards on which electronic components for use in switching circuits with a relatively high rated voltage of 200 V or more are mounted are required to have sufficient insulation distances between leads and improved insulation reliability. However, with the reduction in the size of electronic devices, the sizes of printed circuit boards and electronic components have been reduced. It has therefore become difficult to ensure sufficient insulation distances between the leads. Thus, to comply with the demand for smaller electronic components, it has become an important technical object to ensure sufficient insulation distances between the leads on the electronic components.

For example, Japanese Unexamined Patent Application Publication No. 2007-220963 discloses an electronic device which is soldered to a printed circuit board such that leads are bent in different directions so as to increase the insulation distances between the leads. An electronic component provided with leads is attached to an integral spacer, and the electronic component and the spacer are placed on a printed circuit board. The leads extend through the printed circuit board, and end portions of the leads that project from a back surface that is opposite the mounting surface are soldered to the printed circuit board. The spacer is provided with inter-lead separation walls whose length is greater than the distance by which the leads project. Thus, sufficient insulation distances are ensured.

SUMMARY OF THE INVENTION

According to one aspect of the present invention, an electronic device includes an electronic component, a printed circuit board, a first insulating spacer, and a second insulating spacer. The electronic component is provided with a plurality of leads. The printed circuit board has a front surface and a back surface opposite to the front surface. The printed circuit board is provided with a plurality of through holes and a groove hole which pass through the printed circuit board from the front surface to the back surface. The plurality of through holes are capable of receiving the plurality of leads, respectively. A number of the plurality of through holes is equal to a number of the plurality of leads. The groove hole is formed so as to cross straight lines that connect the through holes. The first insulating spacer is provided on the groove hole between the leads so as to isolate the leads from each other. The first insulating spacer is positioned between the electronic component and the front surface of the printed circuit board. The second insulating spacer is inserted through the groove hole from the back surface of the printed circuit board and engages with the first insulating spacer so as to isolate end portions of the leads from each other.

According to another aspect of the present invention, a power converter used at a rated voltage of 200 V or more includes an electronic component, a printed circuit board, a first insulating spacer, and a second insulating spacer. The electronic component is provided with a plurality of leads. The printed circuit board has a front surface and a back surface opposite to the front surface. The printed circuit board is provided with a plurality of through holes and a groove hole which pass through the printed circuit board from the front surface to the back surface. The plurality of through holes are capable of receiving the plurality of leads, respectively. A number of the plurality of through holes is equal to a number of the plurality of leads. The groove hole is formed so as to cross straight lines that connect the through holes. The first insulating spacer is provided on the groove hole between the leads so as to isolate the leads from each other. The first insulating spacer is positioned between the electronic component and the front surface of the printed circuit board. The second insulating spacer is inserted through the groove hole from the back surface of the printed circuit board and engages with the first insulating spacer so as to isolate the end portions of the leads from each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
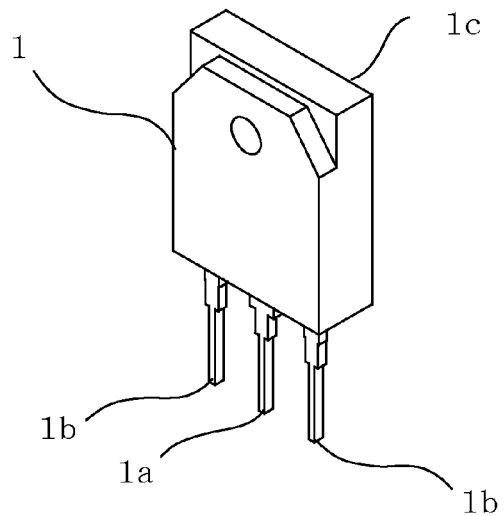
FIG. 1 is a diagram illustrating the shape of an electronic component.

Embodiments will now be described with reference to the accompanying drawings, wherein like reference numerals designate corresponding or identical elements throughout the various drawings.

FIG. 1 is a diagram illustrating the shape of an electronic component. In FIG. 1, three leads, which are a central lead 1*a* and leads 1*b* on both sides of the central lead 1*a*, are provided at the bottom of the electronic component 1. End portions of the leads 1*a* and 1*b* are portions to be soldered. A radiator 1*c* that radiates heat when heat is generated is attached to the back surface of the electronic component 1.

Figure 2:
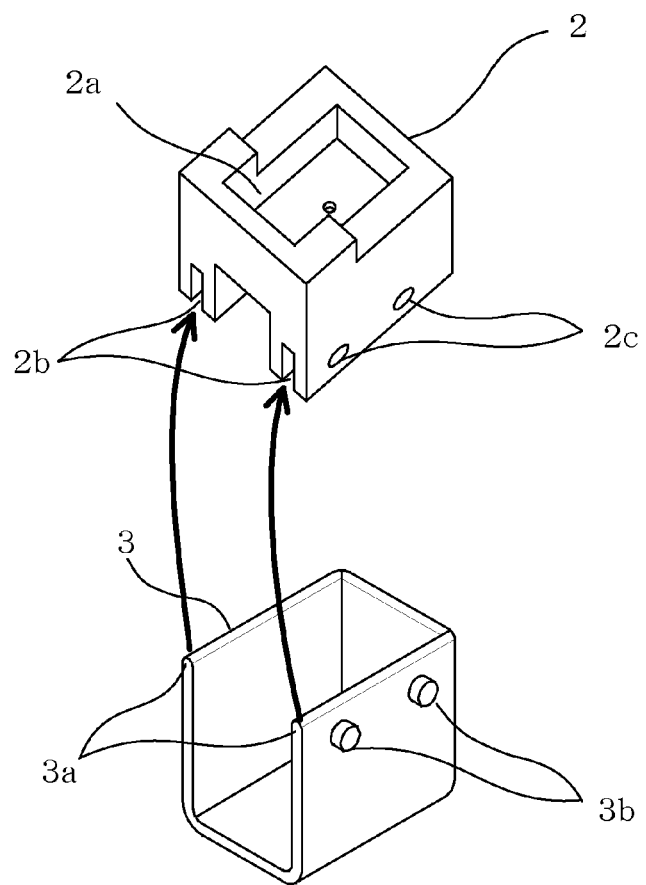
FIG. 2 is a diagram illustrating a first insulating spacer and a second insulating spacer according to a first embodiment of the present invention.

FIG. 2 is a diagram illustrating a first insulating spacer 2 and a second insulating spacer 3 according to a first embodiment of the present invention. The first insulating spacer 2 is shaped such that the first insulating spacer 2 can receive the lead 1a, and has a tubular shape so as to surround the entire circumference of the lead 1a. According to the present embodiment, a lead-receiving section 2a is formed such that a hole diameter at the top is large and a hole diameter at the bottom is smaller than that at the top. The hole diameter at the bottom of the lead-receiving section 2a is set such that the lead 1a can be inserted through the lead-receiving section 2a and be fitted thereinto. When the electronic component 1 is attached to the first insulating spacer 2, the lead 1a is fitted into the lead-receiving section 2a at the bottom thereof. The lead-receiving section 2a is filled with insulating resin 4 at the top thereof.

In the present embodiment, the first insulating spacer 2 has a rectangular tubular shape so as to surround the entire circumference of the lead 1a in a cross section perpendicular to the lead insertion direction. However, the first insulating spacer 2 may have other shapes, such as a circular shape. Alternatively, instead of the tubular shape, the first insulating spacer 2 may have a shape such as a U-shape or an L-shape that does not surround the entire circumference of the lead 1a, as long as the leads 1a and 1b can be isolated from each other.

A first projection 3a having a projecting shape is provided at the top of the second insulating spacer 3. The first projection 3a is formed such that the first projection 3a can be received by and engaged with a first recess 2b having a recessed shape that is provided at the bottom of the first insulating spacer 2. Second projections 3b having a projecting shape are formed on a side surface of a portion of the second insulating spacer 3 that engages with the first insulating spacer 2. When the first insulating spacer 2 and the second insulating spacer 3 engage with each other, the second projections 3b are received by and fitted into second recesses 2c that are formed in a side surface of the bottom portion of the first insulating spacer 2. Thus, the first insulating spacer 2 and the second insulating spacer 3 are securely connected to each other.

Figure 3:
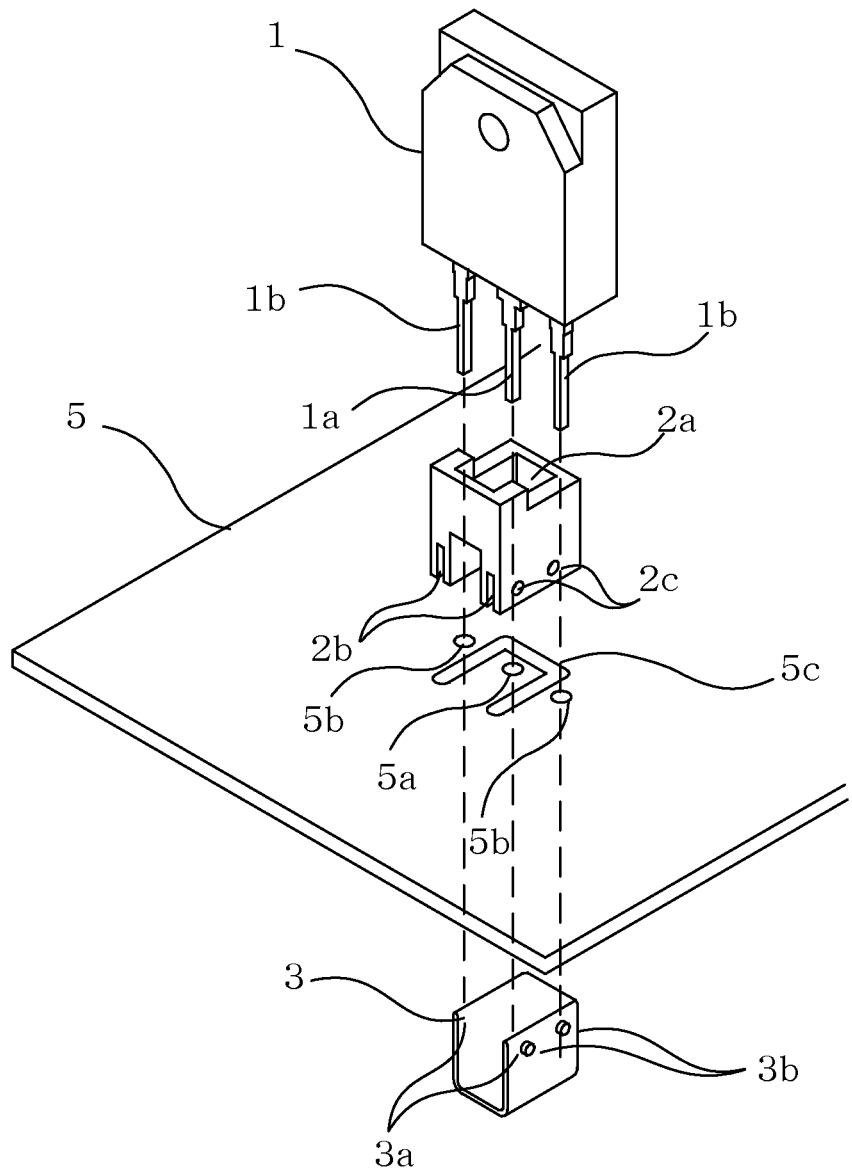
FIG. 3 is a diagram illustrating an electronic device according to the first embodiment.

FIG. 3 is a diagram illustrating an electronic device according to the present embodiment. A printed circuit board 5 is provided with a central through hole 5a and through holes 5b on both sides of the through hole 5a in an area where the electronic component 1, the first insulating spacer 2, and the second insulating spacer 3 are mounted. The central lead 1a is inserted through the central through hole 5a, and the leads 1b on both sides of the central lead 1a are inserted through the through holes 5b on both sides of the central through hole 5a. In addition, a groove hole 5c is formed so as to surround the through hole 5a and cross a straight line that connects the through hole 5a and the through holes 5b. The groove hole 5c is shaped such that the groove hole 5c can receive the top portion of the second insulating spacer 3.

Figure 4A:
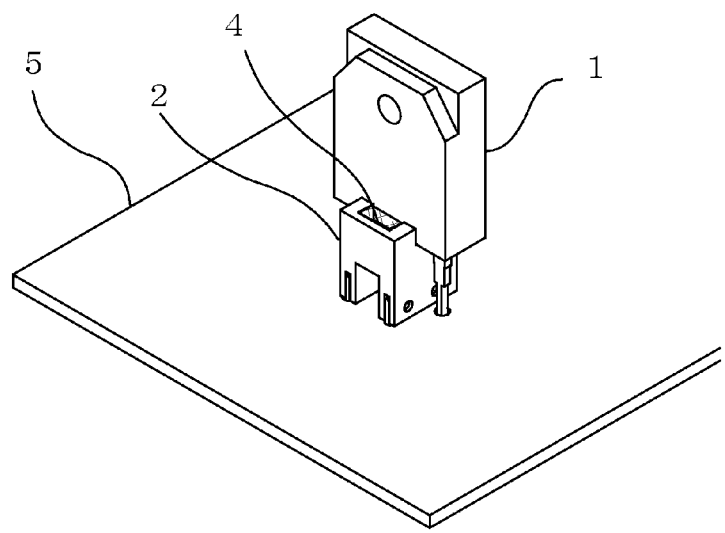
FIG. 4A is another diagram illustrating the electronic device according to the first embodiment.
Figure 4B:
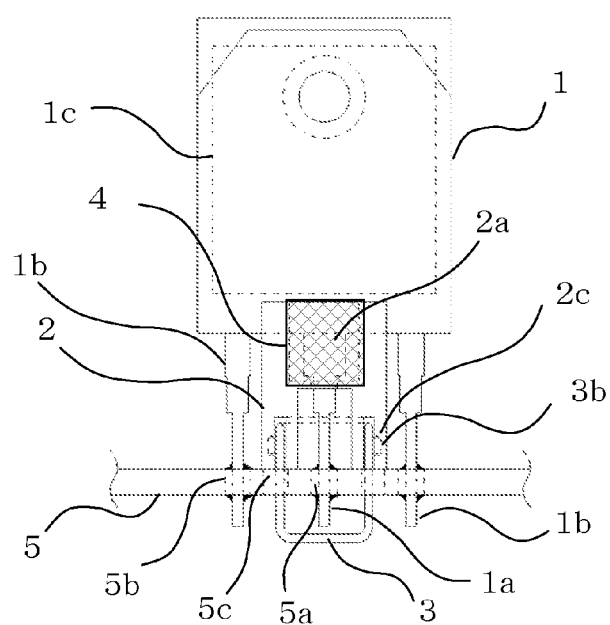
FIG. 4B is another diagram illustrating the electronic device according to the first embodiment.
Figure 4C:
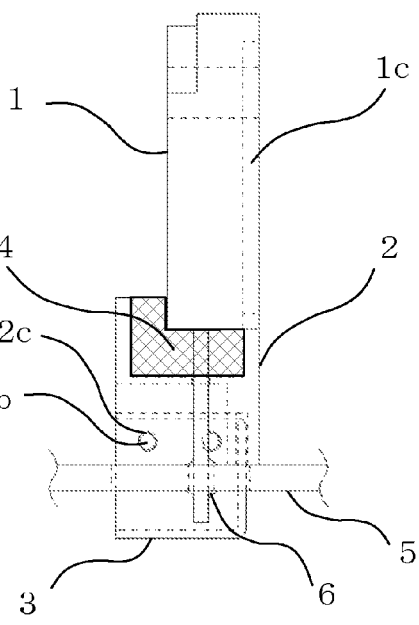
FIG. 4C is another diagram illustrating the electronic device according to the first embodiment.

A method for manufacturing the electronic device will now be described with reference to FIGS. 4A to 4C, which illustrate the electronic device according to the present embodiment. Processing steps (1) to (6) included in the method will be described in the order in which the steps are performed.

(1) Attachment of Electronic Component

The central lead 1a provided on the electronic component 1 is inserted through the lead-receiving section 2a of the first insulating spacer 2, and the electronic component 1 is attached to the first insulating spacer 2 such that the bottom surface of the electronic component 1 is in contact with the attachment surface of the upper portion of the first insulating spacer 2. The hole diameter at the bottom of the lead-receiving section 2a is set such that the lead 1a can be inserted through the lead-receiving section 2a and be fitted therein. Therefore, when the lead 1a is inserted through the lead-receiving section 2a, the electronic component 1 and the first insulating spacer 2 are temporarily fixed to each other.

(2) Preparation of Printed Circuit Board

The through holes 5a and 5b, which receive the end portions of the leads 1a and 1b, respectively, are formed in the area where the electronic component 1, the first insulating spacer 2, and the second insulating spacer 3 are to be mounted. In addition, the groove hole 5c, which receives the top portion of the second insulating spacer 3, is formed so as to surround the through hole 5a and cross a straight line that connects the through hole 5a and the through holes 5b. Thus, the printed circuit board 5, which is processed as described above, is prepared. This step may be performed prior to the above-described step of attaching the electronic component.

(3) Attachment of First Insulating Spacer

The first insulating spacer 2, to which the electronic component 1 is attached, is attached to the printed circuit board 5. In this case, the end portions of the leads 1a and 1b are inserted into the through holes 5a and 5b, respectively, in the printed circuit board 5, and the first insulating spacer 2 is placed on the printed circuit board 5. Thus, positioning and installation can be easily performed. In addition, flow soldering can be easily performed in a subsequent soldering step.

The lengths of the leads 1a and 1b are set such that the end portions of the leads 1a and 1b project from the back surface of the printed circuit board 5 by a distance necessary to allow the end portions to be soldered.

(4) Soldering

The end portions of the leads 1a and 1b are soldered to connection terminals provided on the printed circuit board 5 by flow soldering, which allows the soldering to be completed in a short time.

In flow soldering, the printed circuit board 5 on which the electronic component 1 and the first insulating spacer 2 are mounted is placed on a moving rail. The printed circuit board 5 is moved such that portions to be soldered 6, which are the end portions of the leads 1a and 1b that project from the back surface of the printed circuit board 5, and the connection terminals on the printed circuit board 5 come into contact with molten solder contained in a reservoir. Thus, the molten solder adheres to the portions to be secured 6, and the electronic component 1 and the first insulating spacer 2 are fixed to the printed circuit board 5.

In the flow soldering, no projections, such as separation walls, other than the end portions of the leads 1a and 1b are provided on the back surface of the printed circuit board 5. Therefore, there is nothing that obstructs the solder from flowing. In other words, solderability is improved and the soldering process can be performed in a short time.

(5) Attachment of Second Insulating Spacer

The second insulating spacer 3 is installed so as to entirely cover the projecting portion of the lead 1a such that the end portions of the leads 1a and 1b that project from the back surface of the printed circuit board 5 are isolated from each other. The top portion of the second insulating spacer 3 is inserted through the groove hole 5c in the printed circuit board 5 from the back surface side thereof. Accordingly, the second insulating spacer 3 serves as separation walls between the leads 1a and 1b in the range from the end portions to intermediate portions of the leads 1a and 1b. Thus, certain insulation distances can be provided between the leads 1a and 1b.

The first projection 3a with a projecting shape provided at the top of the second insulating spacer 3 is inserted into the first recess 2b with a recessed shape provided at the bottom of the first insulating spacer 2. Thus, the first insulating spacer 2 and the second insulating spacer 3 are engaged with each other. When the first insulating spacer 2 and the second insulating spacer 3 are engaged with each other in a certain position, the second projections 3b with a projecting shape provided on the second insulating spacer 3 are received by and fitted into the second recesses 2c formed in a side surface of the bottom portion of the first insulating spacer 1. Accordingly, the first insulating spacer 2 and the second insulating spacer 2 are securely connected to each other.

(6) Injection and Curing of Insulating Resin

The insulating resin 4, which is composed of epoxy resin or silicon resin, is injected into the lead-receiving section 2a through a gap between the electronic component 1 and the first insulating spacer 2, so that the gap between the electronic component 1 and the first insulating spacer 2 is sealed with the insulating resin 4. After that, the insulating resin 4 is cured at room temperature or increased temperature. Accordingly, spaces between root portions of the leads 1a and 1b are sealed with the solidified insulating resin 4, and the insulation performance is greatly improved.

Thus, certain insulation distances can be provided over the entire range from the root portions to the end portions of the leads 1a and 1b. In addition, the electronic component 1, the first insulating spacer 2, and the second insulating spacer 3 are securely fixed to the printed circuit board 5.

In the case where the distance between the electronic component 1 and the printed circuit board 5 is short, there is a possibility that the heat at the soldered portions will be conducted to the main body of the electronic component 1 through the leads 1a and 1b. If the radiator 1c is attached to the electronic component 1 and parts of the leads 1a and 1b are connected to the radiator 1c, the heat at the soldered portions will be conducted through the leads 1a and 1b and radiated into the atmosphere from the radiator 1c. As a result, the temperature of the soldered portions will decrease and solder wicking will be reduced.

In this embodiment, the distance between the bottom surface of the electronic component 1 and the surface of the printed circuit board 5 (vertical dimension of the first insulating spacer 2) is appropriately adjusted. The lengths of the leads 1a and 1b are set accordingly. Thus, the heat conduction in the soldering process can be reduced and the influence of the thermal radiation caused by the radiator 1c can be controlled.

Thus, it is not necessary to perform the process of increasing the distances between the leads by bending the leads, and certain insulation distances can be provided over the entire range from the root portions to the end portions of the leads in a small mounting space. In particular, the insulation distances between the end portions of the leads may be maintained at certain distances by the second insulating spacer 3. In addition, the space around the root portion of one of the leads is filled with the resin so that the gap between the electronic component and the first insulating spacer is sealed. Therefore, the insulation between the root portions of the leads is improved, and dust, conductive foreign bodies, etc., are prevented from entering the gap. Thus, the reliability of the insulation is increased. In addition, the attachment strength of the electronic component on the printed circuit board is greatly increased. Further, the solderability in the soldering process is increased, and the influence of the high-temperature heat generated in the soldering process on the electronic component is reduced. Thus, an electronic device having high insulation performance and high reliability and a method for manufacturing the electronic device are provided by utilizing a simple mounting structure and a simple mounting method.

In the case where the above-described electronic device is used in a power converter, the insulation performance can be improved and the reliability can be increased even when the power converter is used at a relatively high rated voltage, such as 200 V or more.

Figure 5:
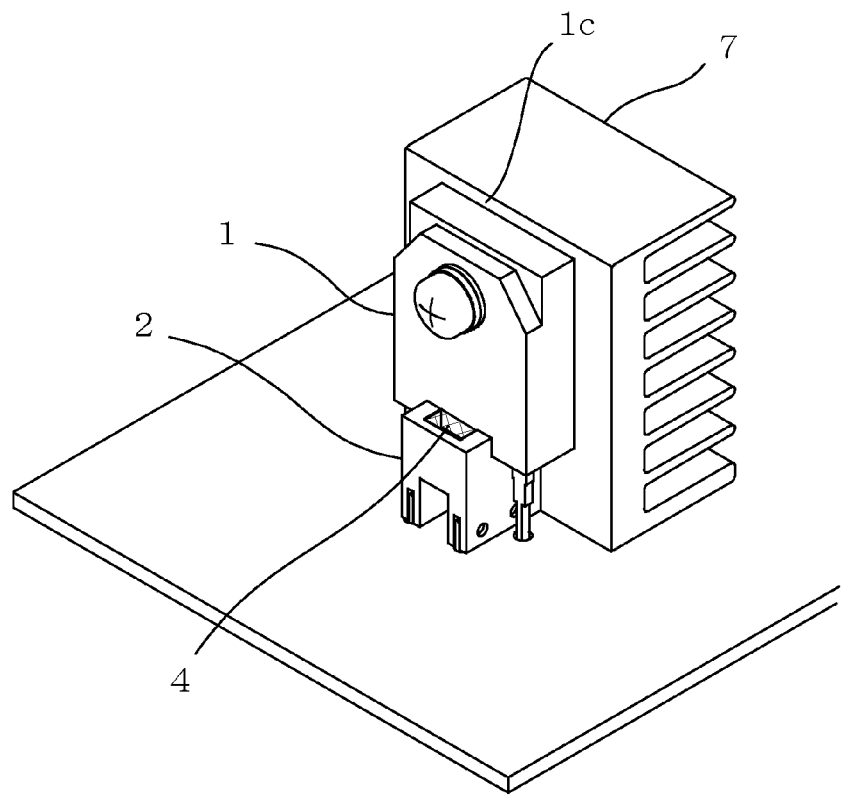
FIG. 5 is a diagram illustrating an electronic device according to a second embodiment of the present invention.

A second embodiment of the present invention will now be described. FIG. 5 is a diagram illustrating an electronic device according to the second embodiment of the present invention. A radiation heat sink 7 made of metal is connected to the radiator 1c in the electronic component 1. Also in this structure, a certain insulation distance can be provided between the central lead 1a and the heat sink 7 by the first insulating spacer 2, the second insulating spacer 3, and the insulating resin 4.

Figure 6:
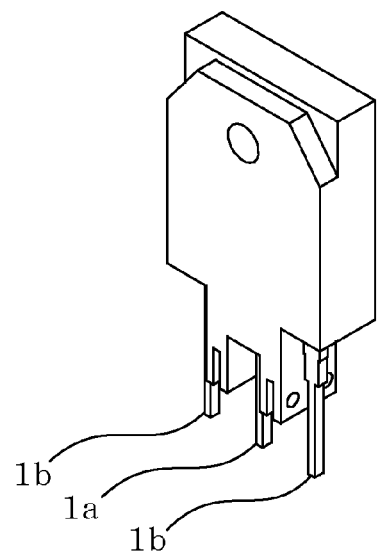
FIG. 6 is another diagram illustrating the electronic device according to the second embodiment of the present invention.

In the first embodiment and the second embodiment, the mounting structure in which the electronic component and the first insulating spacer are individually manufactured is described. However, functions similar to those of the first and second embodiments may be obtained even when the electronic component 1 is integrated with the first insulating spacer 2 and the insulating resin 4, as illustrated in FIG. 6.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An electronic device comprising:
an electronic component provided with a plurality of leads;
a printed circuit board having a front surface and a back surface opposite to the front surface and provided with a plurality of through holes and a groove hole which pass through the printed circuit board from the front surface to the back surface, the plurality of through holes being capable of receiving the plurality of leads, respectively, a number of the plurality of through holes being equal to a number of the plurality of leads, the groove hole being formed so as to cross straight lines that connect the through holes;
a first insulating spacer provided on the groove hole between the leads so as to isolate the leads from each other, the first insulating spacer being positioned between the electronic component and the front surface of the printed circuit board; and
a second insulating spacer that is inserted through the groove hole from the back surface of the printed circuit board and that engages with the first insulating spacer so as to isolate end portions of the leads from each other.

2. The electronic device according to claim 1,
wherein the first insulating spacer includes a lead-receiving section capable of receiving at least one of the plurality of leads, the lead-receiving section being filled with insulating resin.

3. The electronic device according to claim 1,
wherein an end portion of one of the first insulating spacer and the second insulating spacer is provided with a first recess, and
wherein an end portion of another one of the first insulating spacer and the second insulating spacer is provided with a first projection that engages with the first recess.

4. The electronic device according to claim 3,
wherein at least one second recess is provided in a side surface of an end portion of one of the first projection and the first recess, and
wherein at least one second projection that is received by and fitted into the at least one second recess is provided on a side surface of an end portion of another one of the first projection and the first recess.

5. A power converter used at a rated voltage of 200 V or more, comprising:
- an electronic component provided with a plurality of leads;
- a printed circuit board having a front surface and a back surface opposite to the front surface and provided with a plurality of through holes and a groove hole which pass through the printed circuit board from the front surface to the back surface, the plurality of through holes being capable of receiving the plurality of leads, respectively, a number of the plurality of through holes being equal to a number of the plurality of leads, the groove hole being formed so as to cross straight lines that connect the through holes;
- a first insulating spacer provided on the groove hole between the leads so as to isolate the leads from each other, the first insulating spacer being positioned between the electronic component and the front surface of the printed circuit board; and
- a second insulating spacer that is inserted through the groove hole from the back surface of the printed circuit board and that engages with the first insulating spacer so as to isolate the end portions of the leads from each other.

6. The power converter according to claim 5,
wherein the first insulating spacer includes a lead-receiving section capable of receiving at least one of the plurality of leads, the lead-receiving section being filled with insulating resin.

7. The power converter according to claim 5,
wherein an end portion of one of the first insulating spacer and the second insulating spacer is provided with a first recess, and
wherein an end portion of another one of the first insulating spacer and the second insulating spacer is provided with a first projection that engages with the first recess.

8. The power converter according to claim 7,
wherein at least one second recess is provided in a side surface of an end portion of one of the first projection and the first recess, and
wherein at least one second projection that is received by and fitted into the at least one second recess is provided on a side surface of an end portion of another one of the first projection and the first recess.

* * * * *